(12) United States Patent
Agoston et al.

(10) Patent No.: US 6,900,710 B2
(45) Date of Patent: May 31, 2005

(54) ULTRAFAST SAMPLER WITH NON-PARALLEL SHOCKLINE

(75) Inventors: Agoston Agoston, Beaverton, OR (US); John Ebner, Portland, OR (US); Steven Pepper, Portland, OR (US); David Pratt, Tigard, OR (US)

(73) Assignee: Picosecond Pulse Labs, Boulder, CO (US)

(*) Notice: Subject to any disclaimer, the term of this patent is extended or adjusted under 35 U.S.C. 154(b) by 0 days.

(21) Appl. No.: 10/053,529

(22) Filed: Nov. 2, 2001

(65) Prior Publication Data

US 2002/0167373 A1 Nov. 14, 2002

Related U.S. Application Data

(63) Continuation-in-part of application No. 09/833,015, filed on Apr. 10, 2001.

(51) Int. Cl.$^7$ ................................ H01P 1/00; H01P 3/00
(52) U.S. Cl. ....................................... 333/248; 333/239
(58) Field of Search ................................. 333/248, 239

(56) References Cited

U.S. PATENT DOCUMENTS

| | | | |
|---|---|---|---|
| 3,278,763 A | 10/1966 | Grove | |
| 3,629,731 A | 12/1971 | Frye | |
| 3,760,283 A | 9/1973 | Lockwood | |
| 3,768,025 A | * 10/1973 | Hreha | ............... 327/91 |
| 3,909,751 A | 9/1975 | Tang et al. | |
| 4,051,450 A | 9/1977 | Barlow | |
| 4,075,650 A | 2/1978 | Calviello | |
| 4,594,557 A | 6/1986 | Shillady | |
| 4,654,600 A | 3/1987 | Lockwood | |
| 4,745,445 A | 5/1988 | Mun et al. | |
| 4,750,666 A | 6/1988 | Neugebauer et al. | |
| 4,855,696 A | 8/1989 | Tan et al. | |
| 4,910,458 A | * 3/1990 | Forsyth et al. | ............... 324/753 |
| 4,956,568 A | * 9/1990 | Su et al. | ............... 327/321 |
| 5,014,018 A | 5/1991 | Rodwell et al. | |
| 5,105,536 A | 4/1992 | Neugebauer et al. | |

(Continued)

FOREIGN PATENT DOCUMENTS

| | | |
|---|---|---|
| EP | 0320175 A2 | 12/1988 |
| EP | 0453744 A1 | 3/1991 |
| EP | 0753890 A2 | 1/1997 |

OTHER PUBLICATIONS

Boivin et al., "Receiver Sensitivity Improvement by Impulsive Coding," *IEEE Photonics Technology Letters* 9:684–686 (May 1997).

Grove, W.M., "Sampling for Oscilloscopes and Other RF Systems: Dc Through X–Band," *IEEE Transactions on Microwave Theory and Techniques* MTT–14:629–635 (Dec. 1966).

Merkelo et al., "Broad–Band Thin–Film Signal Sampler," *IEEE Journal of Solid–State Circuits* SC–7:50–54 (Feb. 1972).

(Continued)

*Primary Examiner*—Patricia Nguyen
(74) *Attorney, Agent, or Firm*—Klarquist Sparkman, LLP

(57) ABSTRACT

An ultrafast sampling system includes an interposer and a sampler that include series of Schottky diodes configured with a non-parallel waveguide to form shocklines or non-linear transmission line (NLTLs) that produce a differential strobe pulse. The shocklines are defined by non-parallel conductors that are configured as, for example, triangular, dentate, arcuate, or other shapes, or as conductors that have edges that are triangular, dentate, arcuate, or the like. The conductors are defined with respect to a substrate, and are airbridged so that at least some portions of the conductors are displaced from the substrate to reduce waveguide capacitance. Electrical connection to the sampler is made with airline having a inner conductor that is deformable to contact an input pad defined on the sampler.

36 Claims, 9 Drawing Sheets

U.S. PATENT DOCUMENTS

| | | | |
|---|---|---|---|
| 5,157,361 | A | 10/1992 | Gruchalla et al. |
| 5,256,996 | A | 10/1993 | Marsland et al. |
| 5,267,200 | A | 11/1993 | Tobita |
| 5,378,939 | A | 1/1995 | Marsland et al. |
| 5,479,120 | A | 12/1995 | McEwan |
| 5,679,006 | A | 10/1997 | Madelaine |
| 5,789,994 | A | 8/1998 | Case et al. |
| 5,952,727 | A | 9/1999 | Takano et al. |
| 5,956,568 | A | 9/1999 | Shiralagi et al. |
| 6,060,915 | A | 5/2000 | McEwan |
| 6,160,312 | A | 12/2000 | Raad |
| 6,628,849 | B2 * | 9/2003 | Yap et al. .................... 385/3 |

OTHER PUBLICATIONS

Pullela et al., "Multiplexer/Demultiplexer IC Technology for 100 Gb/s Fiber–Optic Transmission," *IEEE Journal of Solid State Circuits* (Mar. 1996).

Whiteley et al., "50 GHz Sampler Hybrid Utilizing a Small Shockline and an Internal SRD," *IEEE MTT–S Digest* AA–6:895–898 (1991).

R. Levy, "New Coaxial–to–Stripline Transformers Using Rectangular Lines", *IRE Transactions on Microwave Theory and Techniques*, 9:273–274 (May 1961).

S. Allen, "Schottky Diode Integrated Circuits for Sub–Millimeter–Wave Applications," University of California (Jun. 28, 1994).

M. Case, "Nonlinear Transmission Lines for Picosecond Pulse, Impulse and Millimeter–Wave Harmonic Generation," University of California (Jul. 2, 1993).

S.T. Allen et al., "725 GHz Sampling Circuits Integrated with Nonlinear Transmission Lines," IEEE Device Research Conference (1994).

M. Rodwell, "GaAs Nonlinear Transmission Lines for Picosecond Pulse Generation and Millimeter–Wave Sampling," *IEEE Trans. Microwave Theory Tech.*, 7:1194–1204 (Jul. 1991)

* cited by examiner

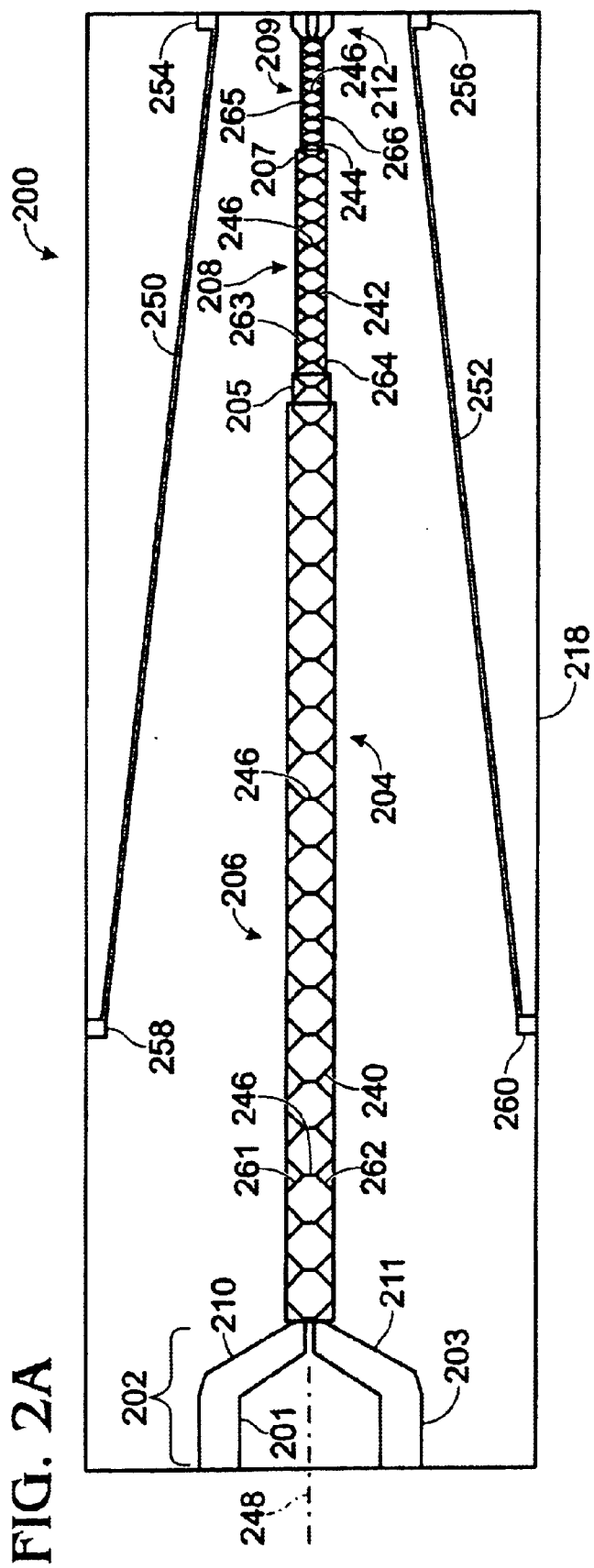

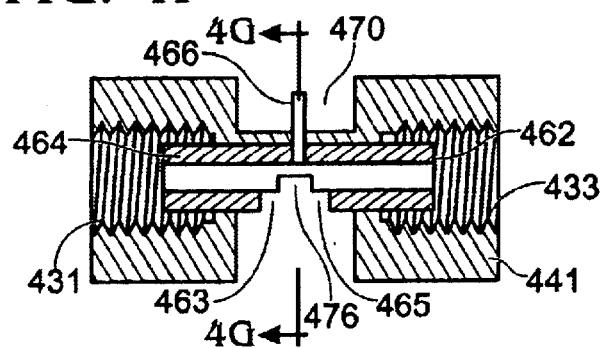
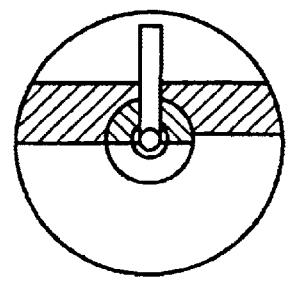
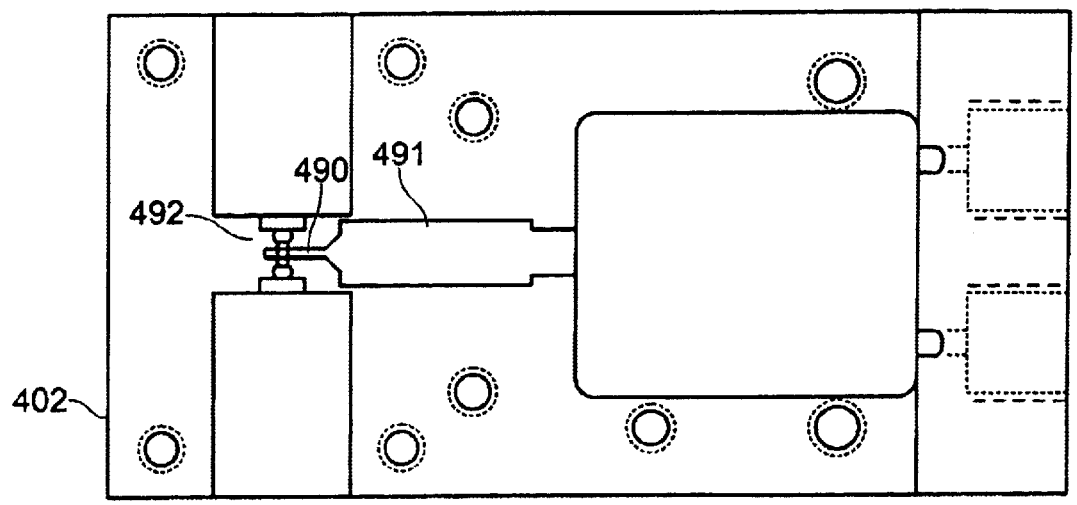

ULTRAFAST SAMPLER WITH NON-PARALLEL SHOCKLINE

RELATED APPLICATIONS

This application is a continuation in part of application Ser. No. 09/833,015, filed Apr. 10, 2001, which is incorporated herein by reference.

FIELD OF THE INVENTION

The invention pertains to methods and apparatus for high speed electrical sampling.

BACKGROUND

The measurement of high speed electrical signals can be performed by sampling the signals at a series of time delays and then plotting signal amplitudes as a function of time. So-called "real time" digitizers typically have sampling rates no greater than about 1–2 Gsample/sec so that electrical signals having frequency components at frequencies greater than a few GHz must be characterized using so-called "equivalent-time" sampling. In equivalent-time sampling, a periodic input signal is sampled at a rate that is much less than the highest frequency component of the input signal over many repetitions of the input signal, and the measurements are assembled to provide an estimate of the input signal during a single period. Equivalent-time sampling is described in, for example, Marsland et al., U.S. Pat. No. 5,378,939 ("Marsland") which is incorporated herein by reference.

For measurement of very high bandwidth electrical signals, equivalent-time sampling systems typically attempt to provide a short duration "strobe pulse" to one or more sampling diodes. The sampling diodes are switched by the strobe pulse, and then a portion (i.e., a sample) of the input signal is communicated to a signal acquisition system. The duration and magnitude of the sample is determined by one or more temporal properties of the strobe pulse, such as rise time, fall time, or duration. Accordingly, for high speed electrical signals, the strobe pulse should have a short rise time, fall time, or duration. Examples of sampling systems and strobe pulse generators for such sampling systems are described in, for example, Marsland, Rodwell et al., U.S. Pat. No. 5,014,108, McEwan, U.S. Pat. No. 6,060,915, Lockwood, U.S. Pat. No. 4,654,600, Lockwood, U.S. Pat. No. 3,760,283, Frye, U.S. Pat. No. 3,629,731, W. M. Grove, "Sampling for oscilloscopes and other RF Systems: Dc through X-band," IEEE Trans. Microwave Theory and Technique MTT 14:629–635 (1966), and W. C. Whitely et al., "50 GHz sampler hybrid utilizing a small shockline and an internal SRD," IEEE MTT-S Digest (1991), which are incorporated herein by reference.

While a fast strobe pulse is needed for such a sampling system, it is also desirable that the connection of an input signal to the sampling system neither introduce signal artifacts nor disturb the signal under test. Sampling systems establish a sample window by switching a sampling diode between conducting and non-conducting states with a fast strobe pulse, and typically a portion of the strobe pulse is transmitted to the device under test. This portion is referred to as "strobe kickout." In addition, a portion of the signal to be measured is typically transmitted around one or more sampling diodes and detected even with the sampling gate closed. This signal portion is referred to as "blowby." It will be apparent that signal artifacts caused by strobe kickout and blowby are preferably avoided. Other signal artifacts are caused by the connection of the sampling system to the signal to be measured. For example, the propagation of high speed electrical signals depends on the waveguide properties of cables and transmission lines on which the electrical signals propagate, and the connection of a sampling system to a cable or a waveguide generally loads the waveguide or presents an unmatched impedance. As a result, electrical signals arriving at the connection are partially reflected and these reflections can appear as artifacts in the measurement of the signal, or can be transmitted to the signal source, thereby changing the signal presented to the sampling system. In some prior art systems, signal artifacts are introduced by connection of the sampling system to a device to be tested so that measurements are corrupted by the connection.

In addition to the problems listed above, the temporal resolution of sampling systems can be limited by strobe pulse duration, strobe pulse rise or fall times, or difficulties in transmitting a strobe pulse to a sampling gate without degradation. Some sampling systems permit sampling only at relatively low sampling rates so that signal acquisition requires measurements over many signal periods. With such systems, because only a small fraction of a signal is measured, data acquisition is slow and random noise in measurements cannot be efficiently reduced by signal averaging.

In view of these and other shortcomings, improved sampling methods, sampling apparatus, as well as methods and apparatus for connecting signal sources to sampling systems are needed.

SUMMARY

Non-linear transmission lines (NLTLs) include a non-parallel waveguide and a plurality of varactors in electrical communication with the non-parallel waveguide. In representative embodiments, the varactors are situated so that an applied electrical signal is temporally reduced. According to representative embodiments, the varactors are Schottky diodes, or Schottky mesa diodes, and the non-parallel waveguide is defined with respect to a semiconductor substrate. In other illustrative embodiments, the non-parallel waveguide includes at least one non-parallel conductor edge, or at least one non-uniform gap.

According to certain aspects of the invention, NLTLs are provided that include a plurality of varactors such as, for example, Schottky diodes, that are configured with respect to at least one of a delay-enhanced, inductance-enhanced, or an impedance-enhanced waveguide. Such enhanced waveguides are generally configured so that a waveguide characteristic parameter or a signal propagation characteristic parameter is larger than a similar parameter of a waveguide that includes substantially linear and/or parallel waveguide features such as gaps or conductors. For example, a propagation delay associated with a delay-enhanced waveguide that connects two locations having a gap or conductor with a dentate boundary or edge has an increased propagation time for electrical signals propagating between the two locations.

According to other representative embodiments, NLTLs include a substrate, a plurality of varactors, and a waveguide defined with respect to the substrate. The waveguide includes a conductor that is airbridged with respect to the substrate. The waveguide is configured with the plurality of varactors so as to temporally reduce an applied electrical signal. In some examples, the conductor is airbridged near the plurality of varactors and the waveguide is a non-parallel waveguide. In still further examples, the conductor includes two or more linear segments and the waveguide includes a periodic waveguide section.

NLTLs configured to temporally reduce an electrical signal include a semiconductor substrate and a non-parallel waveguide. A plurality of semiconductor junctions are distributed along and electrically connected to the non-parallel waveguide. According to representative examples, the non-parallel waveguide can be a microstrip waveguide, a slotline, a coplanar strip waveguide, or other planar or non-planar waveguide. In representative examples, non-parallel waveguides include a non-parallel edge, a non-parallel gap, or combinations thereof.

Samplers include a signal input conductor and a first sampling diode and a second sampling diode in electrical communication with a signal input conductor. A non-linear transmission fine that includes a non-parallel waveguide and a plurality of varactors is configured to receive an unprocessed electrical pulse and deliver sampling strobe pulses to the first sampling diode and the second sampling diode. In additional embodiments, the samplers include an intermediate frequency (IF) waveguide having an IF output. The IF waveguide receives portions of an input electrical signal applied to the input conductor from the first sampling diode and the second sampling diode and delivers the portions to the IF output. In other embodiments, the samplers include a measurement system that is configured to produce an equivalent-time representation of the input electrical signal based on the portions of the input electrical signal received from the IF output.

According to representative embodiments, the sampler non-linear transmission line includes a plurality of Schottky mesa diodes and at least one periodically repeated waveguide section. In some examples, the non-parallel waveguide is a slotline or a coplanar stripline.

According to additional examples, samplers include a strobe waveguide transition configured to receive the sampling strobe pulses from the non-linear transmission line and to deliver enhanced strobe pulses to the first and second sampling diodes. The transition typically includes a junction between a first waveguide and a second waveguide configured to have impedances that produce the enhanced strobe pulses. In some examples, the first and second waveguides are slotlines.

Sampling circuits include a first waveguide configured to receive an input sampling strobe and a second waveguide configured to receive the sampling strobe from the first waveguide. The first and second waveguides have a first impedance and a second impedance, respectively, wherein the first impedance and the second impedance are configured to produce an enhanced sampling strobe from the input sampling strobe. The sampling circuits also include at least one diode electrically controlled by the enhanced sampling strobe and configured to deliver a sampled portion of the input signal to an output. In additional examples, the second waveguide includes a termination configured to direct an inverted portion of the enhanced sampling strobe to the sampling diode, thereby establishing a sampling window. In representative examples, the first waveguide and the second waveguide are slotlines and an IF waveguide is configured to deliver the sampled portion to the output.

Apparatus for electrically connecting a transmission line interior conductor to a conductor pad on a substrate include a compression rod configured to contact the interior conductor. A spring is configured to urge the compression rod toward the interior conductor, so that the interior conductor electrically contacts the conductor pad.

According to further embodiments, apparatus for delivering an electrical signal to a substrate include an airline that has an airline housing and an airline conductor situated within the airline housing. The apparatus also include means for securing a coaxial cable or other transmission line so that the electrical signal is communicated to the airline conductor. Means for urging the airline conductor towards the substrate are also included.

These and other features and advantages of the invention are set forth below with reference to the accompanying drawings.

BRIEF DESCRIPTION OF THE DRAWINGS

FIG. 2A is a schematic plan view of the interposer of FIG. 1.

FIGS. 4C–4G are sectional views illustrating an airline assembly that delivers an electrical signal to the sampler of FIG. 1.

FIG. 4H is a plan view of the lower clamp housing of FIGS. 4A–4B.

DETAILED DESCRIPTION

As used herein, a non-linear transmission lines (NLTL) is an electrical transmission line or waveguide that includes one or more circuit elements having an impedance that varies non-linearly with a voltage or current applied to the circuit element. Such circuit elements include varactors, diodes, ferroelectric dielectrics, superconductor-insulators-superconductors, and/or other devices. Such circuit elements are referred to herein for convenience as varactors. As used herein, a shockline is an NLTL configured to temporally reduce an electrical pulse applied to the shockline. Waveguides and transmission lines typically include one or more conductors, one or more conductor edges, or can be defined by a gap in a one or more conductors. In addition, example embodiments are described that include planar waveguides or transmission lines, but non-planar waveguides can also be used.

Figure 1:
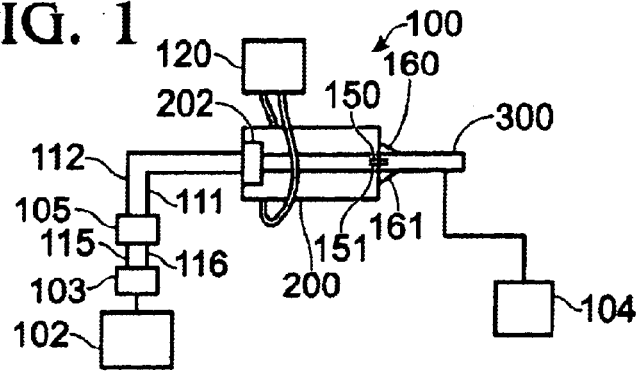
FIG. 1 is a block diagram of a sampling system that includes an interposer and a sampler that are configured to provide sample strobe pulses using shocklines.
Figure 2B:
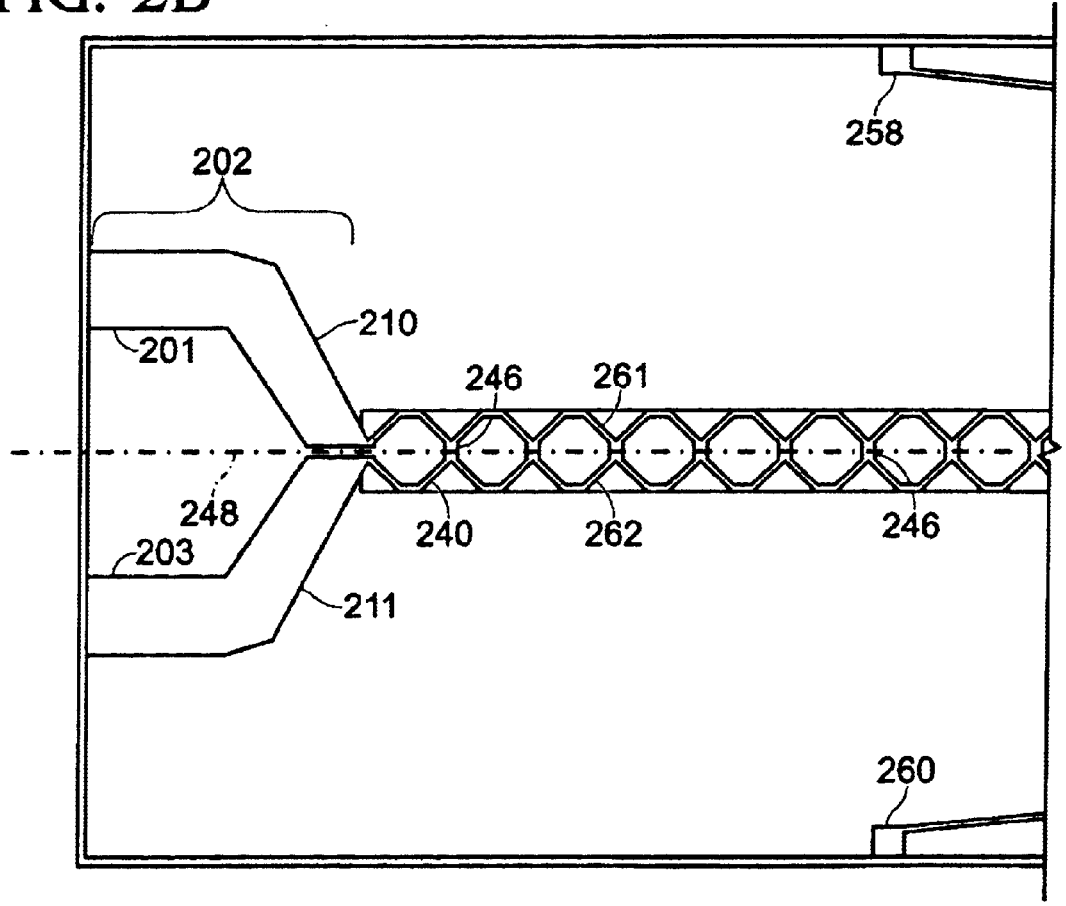
FIGS. 2B–2C are detailed schematic plan views of portions of the interposer of FIG.2A.

With reference to FIG. 1, a sampling system 100 includes a pulse generator 102 that delivers an unprocessed electrical pulse to a pulse splitter 103 and to a mode converter 105 that has outputs 111, 112 that are configured to deliver a differential electrical signal to a mode filter 202 situated on an interposer 200 (shown in FIG. 2A). The mode converter 105 is configured to produce a differential pulse output based on a common mode input supplied to mode converter inputs 115, 116. In an example, the mode filter 202 includes a microstrip input waveguide that provides common mode rejection in addition to the mode conversion produced by the mode converter 105. The interposer 200 and a sampler 300 are configured to receive differential electrical signals from the mode converter 105 and form sampling strobe pulses or other sampling stimulus. The sampler 300 is configured to receive a signal input from a device under test (DUT) 104 and deliver an associated intermediate frequency (IF) output to a measurement system 120. The interposer 200 and the sampler 300 are illustrated in detail in FIGS. 2A–2C and FIGS. 3A–3B, respectively, and a representative mode converter is illustrated in FIGS. 4A–4B.

Figure 2D:
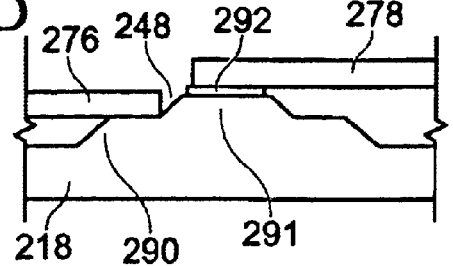
FIG. 2D is a sectional view of a Schottky diode included in the a shockline of the interposer of FIG. 1
Figure 2C:
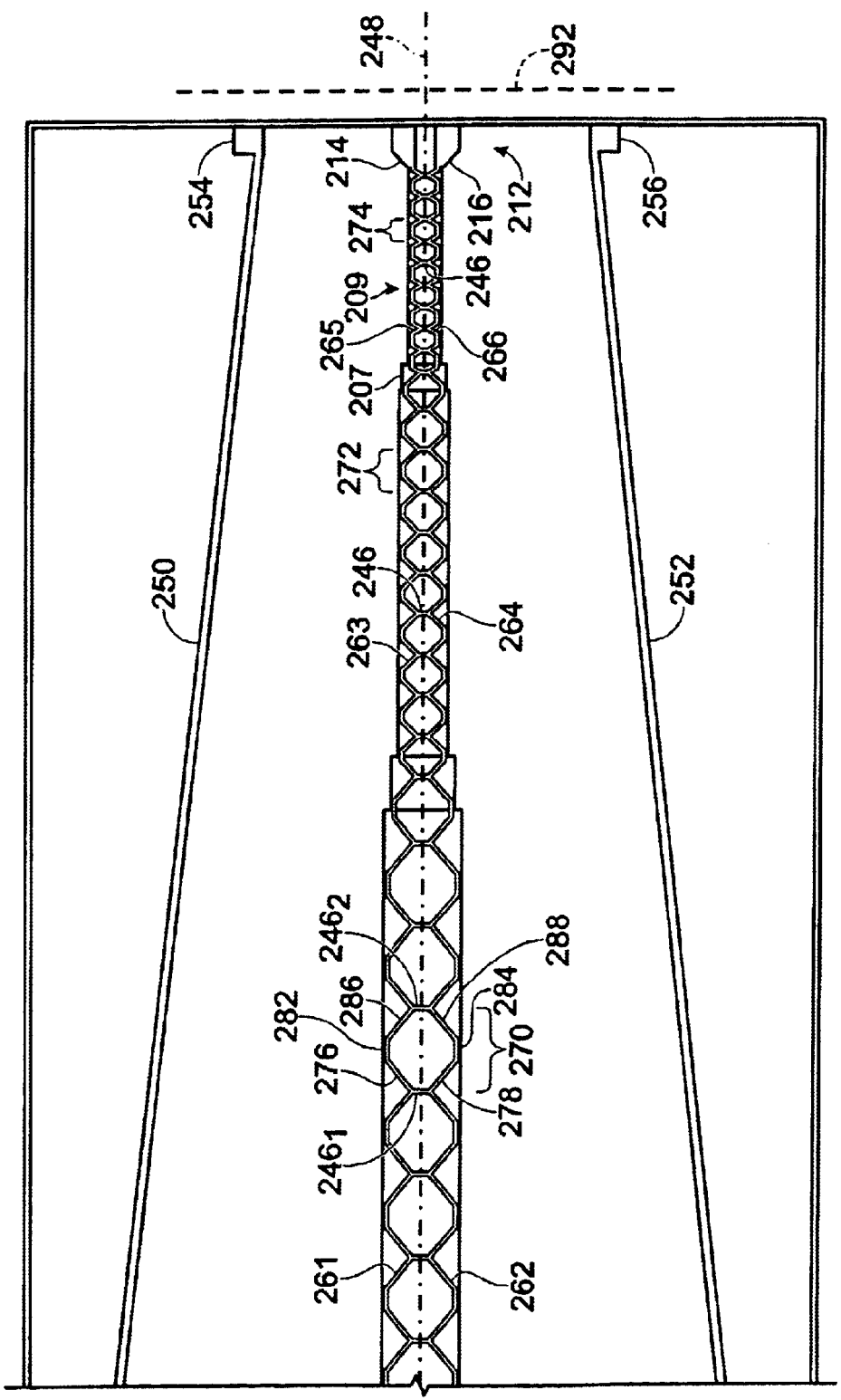

Referring to FIGS. 2A–2C, the interposer 200 receives a sampling stimulus such as the differential electrical signal produced by the mode converter 105 at a mode filter 202 that includes microstrip conductors 201, 203 and transition conductors 210, 211. The mode filter 202 is typically configured to provide an impedance mismatch for common mode electrical signals received from the mode converter 105 and to provide a matched impedance for a differential mode electrical signal received from the mode converter 105. As shown in FIG. 2A, the mode filter 202 includes two microstrip lines associated with the microstrip conductors 201, 203 and a slotline defined by the conductors 210, 211. The interposer 200 includes a shockline 204 having shockline sections 206, 208, 209 and transition shockline sections 205, 207. The shockline 204 is in electrical communication with the mode filter 202 via the transition conductors 210, 211 and with the sampler 300 via an interposer sampling strobe output 212. The interposer sampling strobe output 212 includes conductor pads 214, 216 that are electrically connected to corresponding conductor pads 308, 310 of the sampler 300 using bond wires 150, 151 (shown in FIG. 1). The interposer 200 is typically formed on GaAs substrate 218 or other semiconductor substrate, or an insulating or conductive substrate.

The shockline sections 206, 208, 209 of the interposer 200 include respective non-parallel waveguides 240, 242, 244 that are configured to electrically connect to diodes 246 or other varactors that are situated along an axis 248. (For clarity, only representative diodes are numbered in FIGS. 2A–2C.) As shown in FIGS. 2A–2C, the shockline 204 extends along a linear axis, but in other configurations, shocklines extend along curved, or other axes, or along perimeters or portions of perimeters of shapes such as circles and other shapes, or are otherwise configured. In addition, the shockline 204 of FIGS. 2A–2C is configured as a non-parallel coplanar stripline, but other waveguide configurations can be used.

Figure 4A:
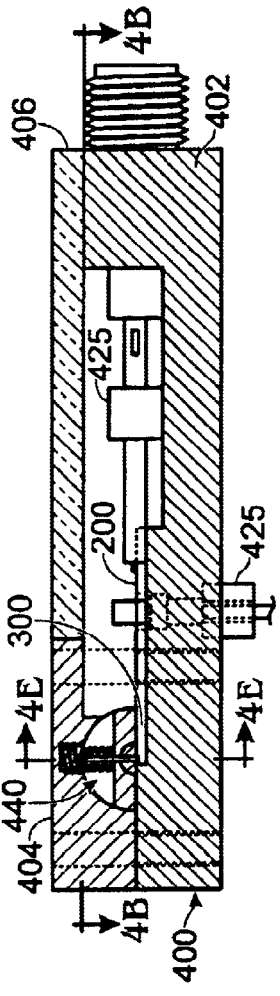
FIGS. 4A–4B are sectional views of a housing configured to retain the interposer and the sampler of FIG. 1.
Figure 4B:
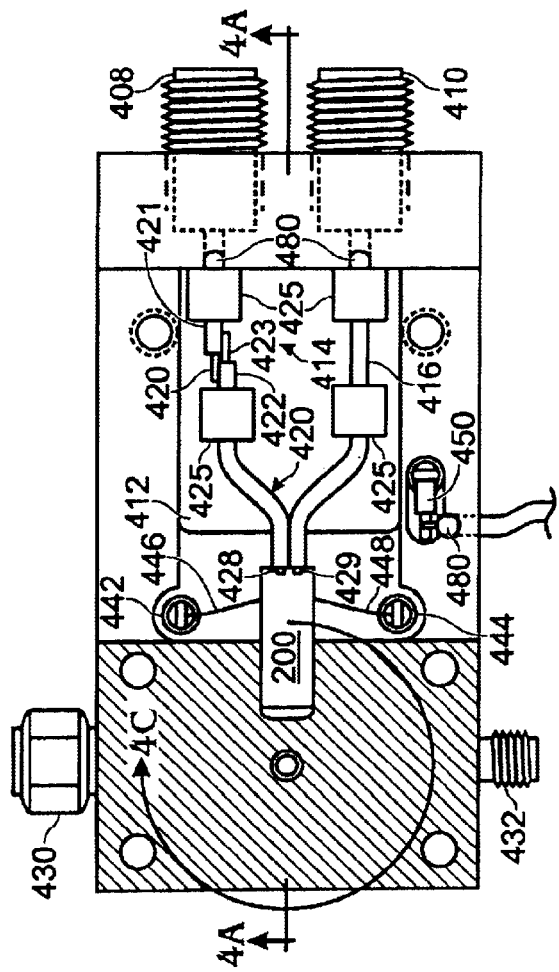
Figure 4C:
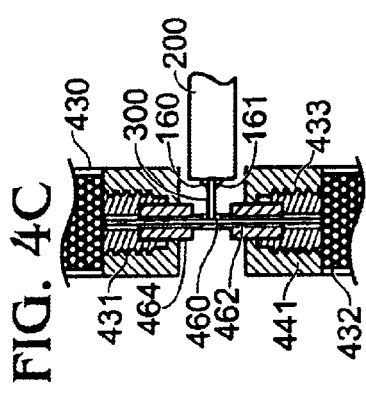
Figure 4D:
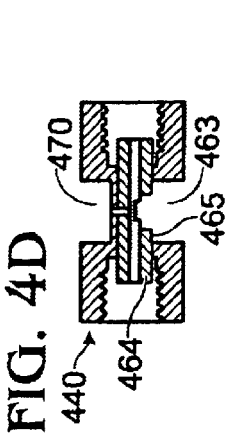
Figure 4E:
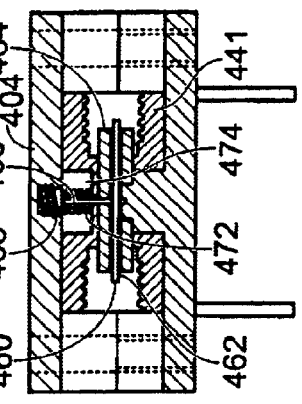

The interposer 200 also includes intermediate frequency (IF) output conductors 250, 252 that are configured as microstrip lines having a common mode impedance of approximately 50 Ohms. The IF output conductors 250, 252 terminate at respective IF input pads 254, 256 and IF output pads 258, 260. The IF inputs pads 254, 256 are configured to receive IF signals from the sampler 300 via bond wires 160, 161 (shown in FIG. 1 and FIG. 4C) or other electrical connection. The IF output pads 258, 260 are configured to deliver IF signals to, for example, a signal acquisition system or other device.

The non-parallel waveguides 240, 242, 244 include respective conductors 261, 262 and 263, 264 and 265, 266 that are configured in a non-parallel coplanar stripline waveguide configuration. These conductors are arranged to form a series of chevron sections such as representative sections 270, 272, 274. Referring to FIG. 2C, in the waveguide section 270, first conductor sections 276, 278 extend outwardly from the axis 248 from a diode $246_1$ at an angle of about 45 degrees with respect to the axis 248 and terminate in straight conductor sections 282, 284. Second conductor sections 286, 288 extend from the respective straight conductor 282, 284 sections to a diode $246_2$. As shown in FIG. 2C, the first conductor sections 276, 278 and the second conductor sections 286, 288 are symmetric about the axis 248 and about an axis 292 that is perpendicular to the axis 248, but such symmetry is not necessary and in other embodiments such symmetry is lacking. In addition, non-parallel waveguides can be configured without straight conductor sections such as the straight conductor sections 282, 284, and conductor sections can be at angles other than 45 degrees with respect to a linear axis. For convenience, conductors such as those of waveguides 240, 242, 244 are referred to as triangular conductors and such triangular conductors can have sections similar to the conductor sections 282, 284 but such conductor sections can be omitted. Providing straight conductor sections and maintaining a substantial separation of conductors permits reduced coupling between conductors.

In order to control waveguide capacitance per unit length, at least some portions of the conductor sections 276, 278, 282, 284, 286, 288, or other waveguide conductors can be situated at least partially above and not on the substrate 218. Such conductor portions are referred to as "airbridges." Referring to FIG. 2D, a representative one of the diodes 246 is defined on a the substrate 218 by an N+ layer 290, an N− layer 291, and a Schottky metal layer 292. The N+ layer 290 and the N− layer 291 are approximately 1.5 $\mu$m thick and 0.4 $\mu$m thick, respectively. The Schottky metal layer 292 is approximately a square having a side of length of about 2 $\mu$m. First conductor sections 276, 278 are electrically connected to the diode 246 and extend from the diode 246 above the substrate 218 at a distance of from about 0.5 $\mu$m to about 4 $\mu$m. Separation of the conductor sections 276, 278 and the substrate 218 is configured to control capacitance. In some examples, edges of conductor sections that face the axis 248 are spaced above the substrate 218, and edges more distant are attached to the substrate 218 to provide mechanical strength. Such airbridging typically increases propagation waveguide velocity and a Bragg frequency associated with a shockline. Airbridged conductors can be included in one or both of the interposer 200 and the sampling circuit 300 but are illustrated only with respect to the interposer 200.

The chevron sections 272, 274 are similar to the chevron section 270, but are smaller. More or fewer sections can be included, and sections of one or more sizes can be used. One or more transition sections can be provided and section dimensions can taper from section to section along the axis 248.

Figure 3A:
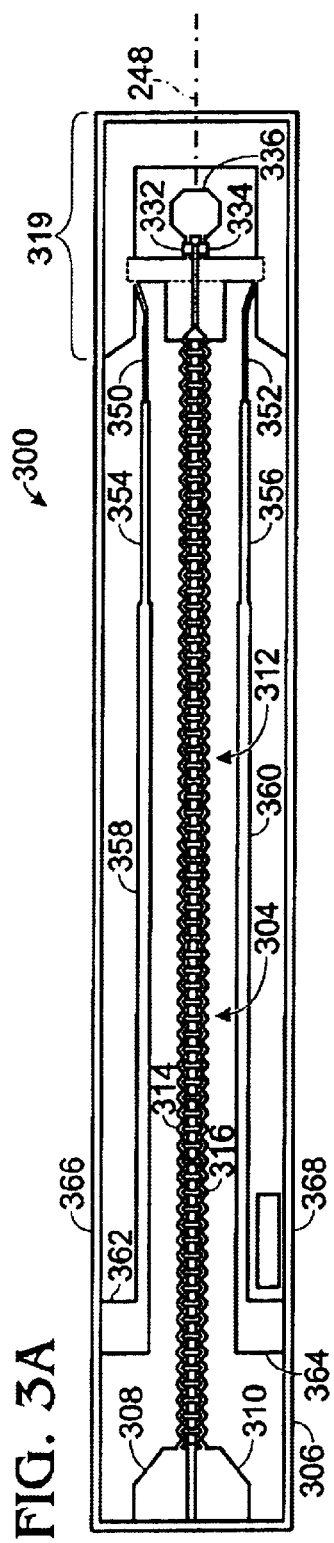
FIG. 3A is a schematic plan view of the sampler of FIG. 1.
Figure 3B:
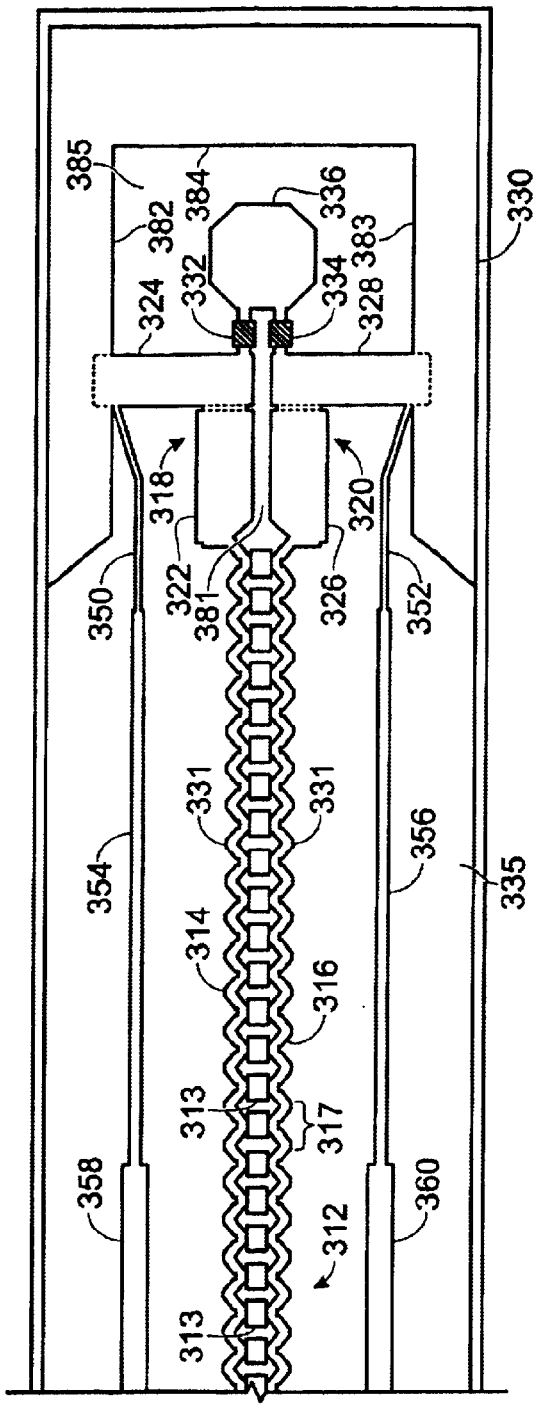
FIG. 3B is a partial schematic plan view of the sampler of FIG. 3A.

Referring to FIGS. 3A–3B, the sampler 300 includes a shockline 304 that is formed on a GaAs substrate 306, other semiconductor substrate, or an insulating or conductive substrate. The shockline 304 is defined by a non-parallel waveguide 312 having conductors 314, 316 that are in electrical communication with the input pads 308, 310, respectively, and a plurality of Schottky diodes 313 or other varactors. The non-parallel waveguide 312 includes one or more chevron sections 317 that are similar to the chevron sections found in the interposer 200. The conductors 314, 316 are typically situated above a surface 335 of the substrate 306 and contact the surface 336 at contact regions 331. These conductors are substantially airbridged, and in other examples, can contact the surface 335 in fewer or more locations, or be situated on the surface 335.

The non-parallel waveguide 312 is electrically connected to a sampling circuit 319 that includes capacitor sections 318, 320 and sampling diodes 332, 334. The capacitor sections 318, 320 include conductors 322, 324 and 326, 328, respectively, that are situated between the substrate surface 335 and a conductor 330 that covers or partially covers one or more of the conductors 322, 324, 326, 328. In this configuration, the conductors 324, 328 are shielded from electrical signals coupled directly from a signal input pad 336, or from other conductors that deliver electrical signals to the signal input pad 336. The conductors 324, 328 form respective sampling hold capacitors as well as forming transmission lines. For example, conductors 322, 324 and 326, 328 define a slotline having a gap 381. Edges 382, 383 of the conductor 330 define a slotline having a gap 385. Electrical signals propagating to the sampling diodes 332, 334 experience an abrupt impedance change produced by gap width change. As shown in FIG. 3B, the gap change is configured to produce a relatively higher impedance at the gap 385 so that an electrical current directed to the sampling diodes 332, 334 produces a correspondingly higher voltage at the sampling diodes 332, 334. A rear edge 384 of the conductor 330 is configured as a short circuit or provide an reflection of a sampling strobe that is returned to the sampling diodes 332, 334, thereby establishing a sampling window.

The sampling circuit 319 also includes the sampling diodes 332, 334 that are electrically connected to the signal input pad 336. For convenience in electrically connecting signals to the input pad 336, a series of wire bond balls can be provided on the input pad 336 to form a conductive "puck" but such a puck is not shown in the figures. First intermediate frequency (IF) conductors 350, 352 extend from the conductors 324, 328, respectively, to respective resistors 354, 356, and respective second IF conductors 358, 360. Respective IF output pads 362, 364 that are conveniently situated at or near respective edges 366, 368 of the substrate 306 and are electrically connected to IF input pads 254, 256 of the interposer 200 with the bond wires 160, 161 shown in FIG. 1.

In representative examples, the interposer 200 and the sampler 300 are fabricated on GaAs substrates, and aspect ratios associated with long, narrow substrates provide limited mechanical strength, so that length reductions provide increased resistance to mechanical failure. Non-parallel waveguides also permit control of waveguide impedance as well as reducing stray capacitance so that any inductance or capacitance associated with conductor sections required to connect to the diodes 246 can be compensated by selection of waveguide geometry. As noted above, some portions of the non-linear waveguide 312 can be airbridged.

Operation of the sampling system 100 is described referring again to FIG. 1. An unprocessed electrical pulse from the pulse generator 102 is delivered to the pulse splitter 103 and portions of the pulse are delivered to the inputs 115, 116 of the mode converter 105. The mode converter 105 delivers a differential (processed) electrical pulse to the mode filter 202 that provides additional common mode rejection. In a representative embodiment, the unprocessed pulse from the pulse generator has an edge transition time $t_{edge}$ of about 70 psec. The shockline 204 is configured so that a processed strobe pulse having a transition time of approximately 10 psec is produced as a voltage differential at the conductor pads 214, 216 of the interposer sampling strobe output 212. The shockline 204 presents a relatively high impedance to common mode electrical signals from the mode filter 202 and is approximately impedance matched to the mode filter 202 for differential mode electrical signals. A mode converter and a mode filter are shown in FIG. 1, but in other embodiments one of both can be omitted. Using a mode converter permits efficient transformation of common mode signals from the pulse splitter 103 into a differential signal Application of a common mode signal to a mode filter such as the mode filter 202 produces a differential mode signal, but is generally less efficient than a mode converter.

The processed (differential) strobe pulse is delivered to the sampler circuit 300 for further processing by the shockline 304 to produce a differential sampling strobe pulse having an edge transition time of approximately 4 psec. The sampling strobe pulse is capacitively coupled at the capacitor sections 318, 320 to the sampling diodes 332, 334 so that the diodes 332, 334 become at least partially conducting. Because the shockline 304 is capacitively coupled to the sampling diodes 332, 334, a low frequency or DC bias can be applied to the shockline 304 to select an operating point for the shockline diodes 313. In an example, the capacitor sections 318, 320 provide coupling capacitances of about 2 pF. The sampling strobe pulse propagates along slotlines that include gaps 381, 385 that enhance a voltage delivered to the sampling diodes 332, 334. The edge 384 of the conductor 330 serves as a short circuit so that a portion of the sampling strobe pulse is inverted and reflected back to the sampling diodes 332, 334, controlling the duration during which the sampling diodes 332, 334 are conductive. This duration is referred to as a sampling "window." The duration of this sampling window is determined by lithographic processes used to define sampler conductors and gaps. Thus, a DC or low frequency bias can be applied to the shockline diodes 313 while using an inductive differentiator that is a DC short circuit to establish the sampling window. Alternatively, the capacitor sections 318, 320 can be configured to differentiate the sampling strobe pulse.

A test signal from the DUT 104 is applied to the signal input pad 336, and, as controlled by the sampling diodes 332, 334 and the sampling strobe pulse, a portion of the test signal is communicated to the IF output pads 258, 260 of the interposer 200 and to a measurement system 110. The measurement system can be configured to produce an equivalent-time reconstruction of the signal applied to the input pad 336, as well as providing signal processing such as signal averaging.

For superior performance, an NLTL can be configured to have a selected small signal impedance at at least some locations at an operating voltage. Impedance matching between the interposer 200 and the sampling circuit 300 generally enhances performance. According to a specific embodiment, the sampling system 100 includes the interposer 200 and the sampling circuit 300 that are fabricated on different substrates. In one example, the interposer substrate 218 had dimensions of about 5 mm by 10 mm, and the sampling circuit substrate 306 had dimensions of about 4 mm by 0.5 mm. The sampling circuit preferably has dimensions such that (high frequency) slab resonances are out of a measurement bandwidth, or above about 100 GHz. The narrow (0.5 mm) dimension is adequate to control slab resonances, but a substrate having such a dimension can be difficult to fabricate unless overall part size is kept small. Thus, splitting the sampling system 100 enhances manufacturability. In addition, connection of the interposer 200 to the sampling circuit 300 includes a transition from a coplanar strip waveguide (the non-parallel waveguide 244) to a slotline (the interposer sampling strobe output 212 and the conductor pads 308, 310 of the sampler 300) back to a coplanar strip waveguide (the non-parallel waveguide 312). These transitions maintain differential mode impedance so that a differential strobe pulse is delivered to the sampler 319.

FIGS. 4A–4B illustrate a housing 400 for the sampling system 100 that includes a lower clamp block 402, and upper clamp block 404, and a balun circuit lid 406. Two electrical connectors 408, 410, typically so-called "K-connectors" are fixed to the lower clamp block 402 and respective rigid coaxial cables 414, 416 or other transmission lines extend from the connectors 408, 410 into a balun recess 412. The cable 414 extends to a cable 418 at which a central conductor 420 and an outer conductor 421 of the cable 414 are electrically connected to an outer conductor 422 and a central conductor 423, respectively, of the cable 416. This arrangement of cables produce mode conversion of a common mode input electrical signal into a differential mode electrical output signal. Ferrite beads 425 are provided for the cables 414, 416, 420. The cables 414, 420 are formed so that respective central conductor ends 428, 429 electrically connect, to the conductors 201, 203 of the mode filter 202 on the interposer 200.

Electrical connectors 430, 432 are provided for receiving and transmitting electrical signals from a device under test (DUT) or other signal source. The connectors are typically so-called 1.0 mm connectors and are available from, for example, Agilent Technologies. The connectors 430, 432 connect to an airline housing 441 of an airline assembly 440 that is configured to provide an electrical connection to the input pad 336 of the sampler 300. IF output feed-through terminals 442, 444 are provided that are electrically connected to the IF output pads 258, 260 with respective bond wires 446, 448. Additional ferrite beads 425 are provided for the feed-through terminals 442, 448 and are typically attached with an epoxy or other adhesive. A blow-by compensation feed-through 450 is also provided.

Referring to FIGS. 4C–4G, the airline housing 441 is configured to receive the connectors 430, 432 at respective threaded portions 431, 433. The connectors 430, 432 support a central airline conductor 460 that is situated in an airline tube 462. The airline tube is retained by a tube carrier 464 and the central conductor 460 and the airline tube 464 define an air-spaced transmission line. A recess is defined in the airline tube 462 to receive a compression rod tube 466. A compression rod 468 is insertable into a bore in the compression rod tube 466. The compression rod 468 is typically made of an electrically insulating material such as a glass or plastic fiber, but in some examples, a conductive material is used. The compression rod 468 is situated within the compression rod tube 466 to deform the central conductor 460 so that the central conductor 460 electrically contacts the input pad 336 (or a conductive puck formed on the input pad 336). The tube carrier 464 and the airline housing 441 define respective recesses 465, 463 configured to receive the sampler 300 so that the central conductor 460 can contact the input pad 336. A recess 470 is defined in the airline housing 441 to receive a spring 472 that is retained on the compression rod 468 with a sleeve 474. The spring 472 is configured to urge the central conductor into an electrical connection with the input pad 336 when the upper clamp housing 404 is attached to the lower clamp housing 402. The airline housing 441 also defines a recess 476 that receives the sampler 300 so that the input pad 336 can contact the central conductor 460. Other portions of the airline housing 441 serve to at least partially surround and shield the sampler 300. As shown in FIGS. 4C–4G, the airline assembly includes several parts, but in other examples, parts can be combined.

Referring to FIG. 4H, the lower clamp housing 402 includes recesses 490, 491, 492 that are configured to receive the interposer 200, the sampler 300, and the airline housing 441, respectively. The lower clamp block 402 and other portions of the housing 400 are conveniently made of brass, or other conductive material, and portions of the housing 400 can be gold plated. Solder holes 480 are provided for attachment of, for example, rigid coaxial cables, to the housing 400.

The housing 400 described above includes an airline defined by the central conductor 460 and the airline tube 462 that serves as an outer conductor. Alternatively, transmission lines that have elliptical or other non-circular cross-sections can be used. An airline can be defined by an interior conductor and an airline housing, wherein the interior conductor is situated at a center of the airline housing or at other locations within the airline housing. In addition, transmission lines that include a dielectric situated between an interior conductor and an outer conductor such as a housing can be used. With such a transmission line, some portion of the dielectric can be removed for electrical connection to an input pad or other conductor.

As described above, a spring can be used to urge a conductor into electrical contact with an input pad or other conductor. Alternatively, spring washers, elastic materials or the like, or a set screw can be used for this purpose.

Figure 5A:
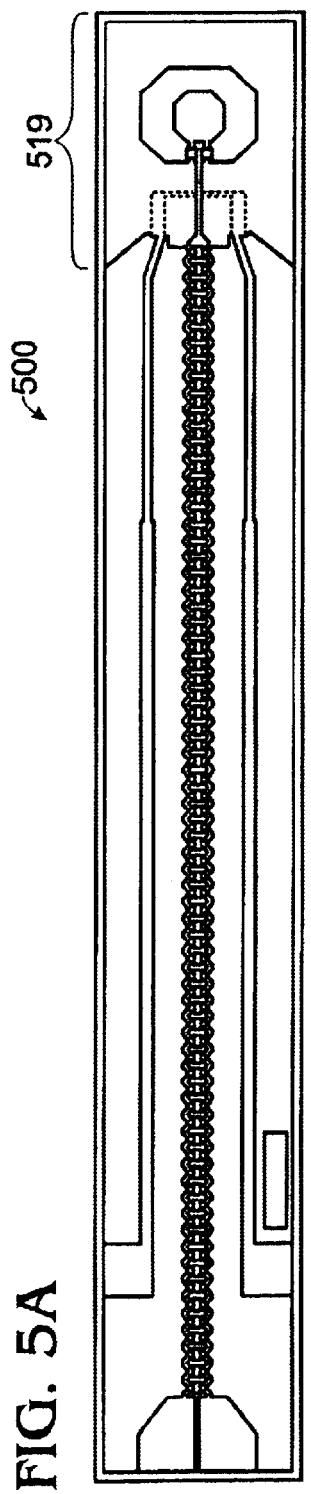
FIG. 5A is a schematic plan view of another representative embodiment of a sampler.
Figure 5B:
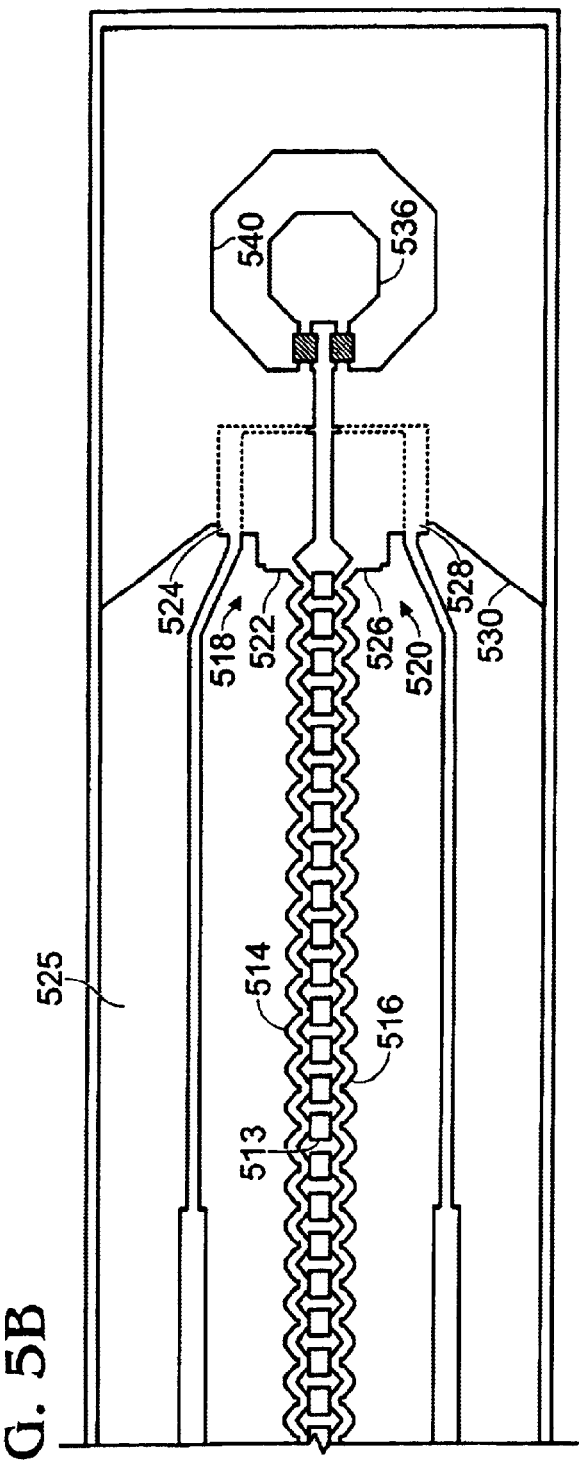
FIG. 5B is a partial schematic plan view of the sampler of FIG. 5A.

FIGS. 5A–5B illustrate a sampler 500 that is similar to the sampler 300. The sampler 500 includes a sampler circuit 519 that includes capacitor sections 518, 520 and a ground conductor 530 that at least partially covers conductors 522, 524, 526, 528. In the sampler 500, a sampling window depends on a length of an interior edge 540.

As shown in FIGS. 3A–3B, the non-parallel waveguide 312 of the sampler 300 includes chevron sections of a single size and that are symmetric about the axis 248, but sections of one or more different sizes can be used and the waveguide and/or waveguide sections need not be symmetric, and non-parallel conductors that are serpentine or curved can be used. Chevron sections can be configured with different angles with respect to the axis 248, and diodes of one or more sizes can be used. Typically, non-parallel waveguides provide additional conductor length without increasing interposer or sampler substrate lengths. As used herein, a non-parallel waveguide includes at least one conductor that is configured to have a curved, angled, or other non-linear edge, or two or more conductors that are configured to have non-parallel edges. Alternatively, a non-parallel waveguide can include a variable width gap. In addition, non-planar waveguides can be similarly configured to have non-parallel edges or non-parallel surfaces. For example, a waveguide can include a conductor having a generally rectangular cross section but that is provided with a series of bumps, tapers, or protrusions. Such waveguides are also referred to as non-parallel waveguides.

In other examples, shockline varactors are arranged along one or more axes, or are arranged along a curved axis such as an arc or a portion of serpentine curve. Fewer or more sections can be provided, and chevron sections can be of a similar size, or two, three, or more different sizes. In addition, non-parallel waveguides can be configured as coplanar strip waveguides, coplanar waveguides, microstrip waveguides, slotline waveguides, and other types of waveguides.

Figure 6:
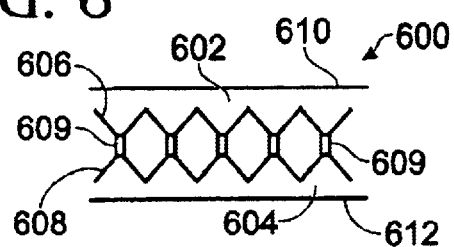
FIGS. 6–10 are schematic plan views of portions of representative non-linear transmission lines that include non-parallel waveguides.

With reference to FIG. 6, a portion of a shockline 600 includes conductors 602, 604 having respective serrated edges 606, 608 that are electrically connected to diodes or other varactors 609. Because high frequency signal propagation along such a waveguide is determined primarily by the edges 606, 608, outer conductor portions 610, 612 can be variously configured.

Figure 7:
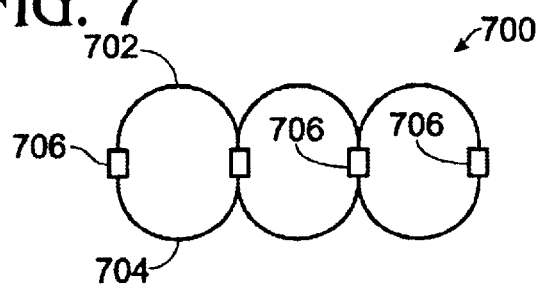

A portion of another representative shockline 700 is illustrated in FIG. 7. The shockline 700 includes curved conductors 702, 704 that electrically connect to diodes 706. As shown in FIG. 7, the shockline is spatially periodic with a fixed period based repeats of a single waveguide section pattern, but in this or other examples, waveguides can includes sections of various sizes and patterns, and need not be periodic.

Figure 8:
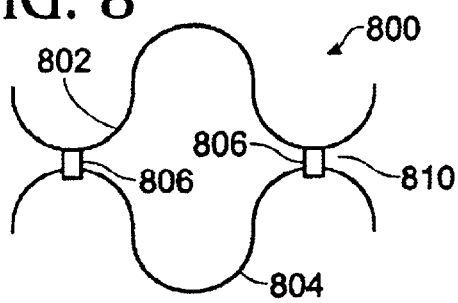

With reference to FIG. 8, an NLTL 800 includes serpentine conductors 802, 804 and varactors 806. Propagation of an electrical signal on the waveguide defined by the conductors 802, 804 (or by a gap 810 in one or more conductors) is relatively delayed with respect to a waveguide that follows a linear path. Such a waveguide is referred to as an enhanced-delay waveguide.

Figure 9:
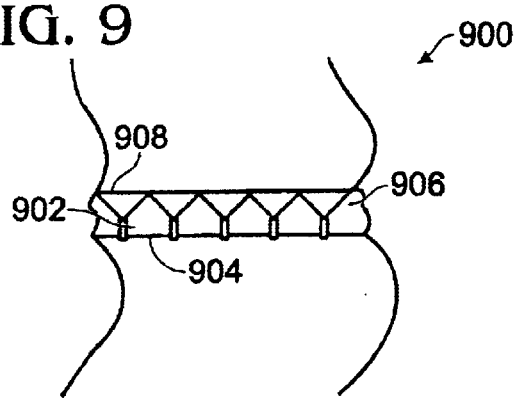

A portion of another representative NLTL 900 is illustrated schematically in FIG. 9. A gap 902 is defined by interior conductor edges 904, 906 and the separation between the conductor edges 904, 906 is variable. As shown in FIG. 9, the conductor edge 906 is dentate, and includes triangular extensions 908, but the edge 906 can assume different shapes.

Figure 10:
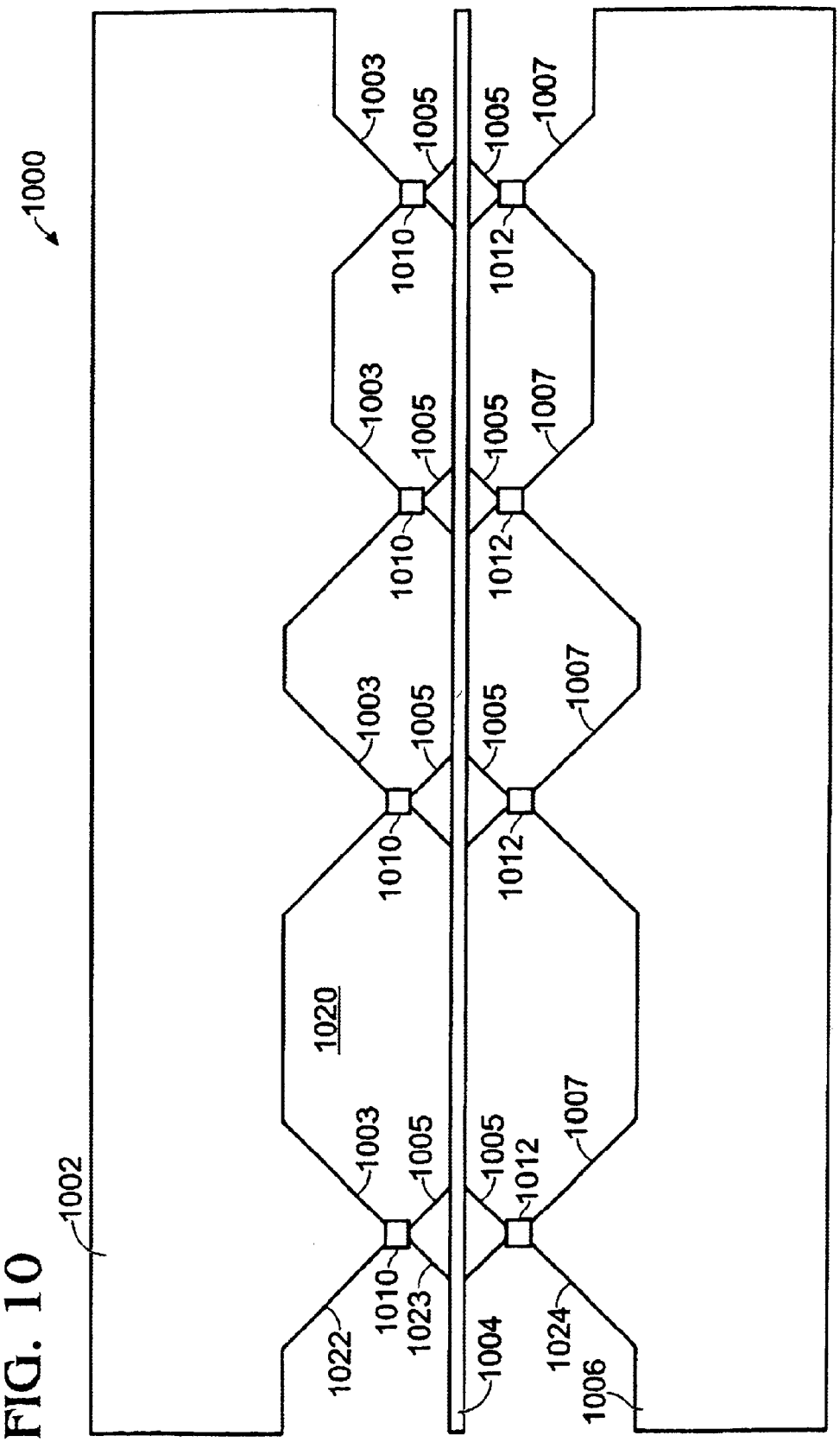

With reference to FIG. 10, a portion of an NLTL 1000 includes conductors 1002, 1004, 1006 and varactors 1010 and varactors 1012. The conductors 1002, 1004, 1006 include triangular projections 1003, 1005, 1007, respectively. The triangular projections 1003, 1005 are airbridged with respect to a substrate surface 1020. Conductor edges 1022, 1023, 1024 are non-parallel to control signal propagation that generally depends on conductor edges.

The example shocklines shown in FIGS. 6–10 and other figures include waveguides defined by conductors that are generally nonparallel or that have edges that are generally nonparallel. As used herein, waveguides defined by conductors that are situated so as to be substantially non-parallel or to have substantially non-parallel edges are referred to as non-parallel waveguides. For example, conductors having serrated edges can be configured to have nonparallel conductor edges. Such non-parallel waveguides need not extend along a single axis.

In the examples described above, Schottky diodes of a several sizes were used as varactors, but other devices and devices of more or fewer sizes can be used. (For convenience, the diodes appear as one size in the drawings.) As a specific example, diodes sizes can be configured in a "step" taper fashion, wherein diode size tapers from a larger diode size at a strobe input end to a smaller size at the sampling circuit. For convenience, only a predetermined number of diode sizes can be used, so that diode size "steps" down at discrete locations as the sampler is approached.

Shocklines can be configured to control various temporal properties of signals such as electrical signals. For example, a rise time, fall time, or duration can be reduced by propagation along a shockline. Such temporal property processing is referred to herein as "temporal reduction." In the examples described herein, non-linear transmission lines are configured for temporal reduction but can be configured for other functions.

Examples have been describe with reference to input and output conductors and waveguides. Generally input conductors/waveguides can be configured as output conductors/waveguides. For example, a representative sampler or sampling circuit can be configured to receive a signal at an IF waveguide and deliver at least some portions of the signal to the signal conductor as controlled by a sampling diode and a sampling strobe. Alternatively, a signal conductor can be configured to receive a signal and deliver at least some portions of the signal to an IF waveguide as controlled by a sampling diode and a sampling strobe.

The embodiments described above are examples only and it will be apparent to those skilled in the art that these embodiments can be modified in arrangement and detail without departing from the principles and scope of the invention. For example, shocklines can be configured to produce strobe pulses having fast rise times, fall times, or both. Sampling system can include one or more interposers and/or samplers, and IF outputs can be configured to operate at bandwidths corresponding to signal bandwidths. A conductive compression rod can be provide for electrical access to an input pad for purposes such as, for example, blow-by compensation. The invention is not to be limited by the described embodiments and we claim all that is encompassed by the appended claims.

We claim:

1. A sampler, comprising:
   a signal conductor;
   a sampling diode in electrical communication with the signal conductor; and
   a non-linear transmission line that includes a non-parallel waveguide and a plurality of varactors, the non-linear transmission line configured to deliver sampling strobe pulses to the sampling diode.

2. The sample of claim 1, further comprising an intermediate frequency (IF) waveguide configured to electrically connect to the signal conductor as controlled by the sampling diode.

3. The sampler of claim 2, further comprising a measurement system configured to receive portions of an electrical signal applied to the signal conductor from the IF waveguide.

4. The sampler of claim 3, wherein the measurement system is configured to produce an equivalent-time representation of the electrical signal.

5. The sampler of claim 2, further comprising a measurement system configured to receive portions of an electrical signal applied to IF waveguide from the signal conductor.

6. The sampler of claim 5, wherein the measurement system is configured to produce an equivalent-time representation of the electrical signal.

7. The sampler of claim 1, wherein the non-linear transmission line includes a plurality of Schottky mesa diodes.

8. The sampler of claim 1, wherein the non-parallel waveguide includes at least one periodically repeated waveguide section.

9. The sampler of claim 1, further comprising a strobe waveguide transition configured to receive the sampling strobe pulses from the non-linear transmission line and to deliver enhanced strobe pulses to the sampling diode.

10. The sampler of claim 1, wherein the non-parallel waveguide is a slotline.

11. The sampler of claim 1, wherein the non-parallel waveguide is a coplanar stripline.

12. A sampling circuit, comprising:
   a first nonparallel waveguide configured to receive a sampling strobe and having a first impedance;
   a second nonparallel waveguide configured to receive the sampling strobe from the first nonparallel waveguide and having a second impedance, wherein the first impedance and the second impedance are configured to produce an enhanced sampling strobe; and at least one diode electrically controlled by the sampling strobe and configured to deliver a sampled portion of an input signal to an output conductor.

13. The sampling circuit of claim 12, wherein the second nonparallel waveguide includes a termination configured to direct an inverted portion of the enhanced sampling strobe to the sampling diode, thereby establishing a sampling window.

14. The sampling circuit of claim 13, wherein the first nonparallel waveguide and the second nonparallel waveguide are slotlines.

15. The sampling circuit of claim 13, further comprising an IF waveguide configured to deliver the sampled portion to the output conductor.

16. A sampler, comprising:

a signal conductor;

a sampling diode in electrical communication with the signal conductor; and a non-linear transmission line that includes a non-parallel waveguide and a plurality of varactors, the non-linear transmission line configured to deliver sampling strobe pulses to the sampling diode, wherein the non-parallel waveguide includes at least one periodically repeated waveguide section.

17. The sampler of claim 16, further comprising an intermediate frequency (IF) waveguide configured to electrically connect to the signal conductor as controlled by the sampling diode.

18. The sampler of claim 17, further comprising a measurement system configured to receive portions of an electrical signal applied to the signal conductor from the IF waveguide.

19. The sampler of claim 18, wherein the measurement system is configured to produce an equivalent-time representation of the electrical signal.

20. The sampler of claim 17, further comprising a measurement system configured to receive portions of an electrical signal applied to IF waveguide from the signal conductor.

21. The sampler of claim 20, wherein the measurement system is configured to produce an equivalent-time representation of the electrical signal.

22. The sampler of claim 16, wherein the non-linear transmission line includes a plurality of Schottky mesa diodes.

23. The sampler of claim 16, further comprising a strobe waveguide transition configured to receive the sampling strobe pulses from the non-linear transmission line and to deliver enhanced strobe pulses to the sampling diode.

24. The sampler of claim 16, wherein the non-parallel waveguide is a slotline.

25. The sampler of claim 16, wherein the non-parallel waveguide is a coplanar stripline.

26. A sampler, comprising:

a signal conductor;

a sampling diode in electrical communication with the signal conductor; and a non-linear transmission line that includes first, second, and third non-parallel waveguide sections having first, second, and third characteristic impedances, respectively, and a plurality of varactors, the non-linear transmission line configured to deliver sampling strobe pulses to the sampling diode.

27. The sample of claim 26, further comprising an intermediate frequency (IF) waveguide configured to electrically connect to the signal conductor as controlled by the sampling diode.

28. The sampler of claim 27, further comprising a measurement system configured to receive portions of an electrical signal applied to the signal conductor from the IF waveguide.

29. The sampler of claim 28, wherein the measurement system is configured to produce an equivalent-time representation of the electrical signal.

30. The sampler of claim 27, further comprising a measurement system configured to receive portions of an electrical signal applied to IF waveguide from the signal conductor.

31. The sampler of claim 30, wherein the measurement system is configured to produce an equivalent-time representation of the electrical signal.

32. The sampler of claim 26, wherein the non-linear transmission line includes a plurality of Schottky mesa diodes.

33. The sampler of claim 26, wherein at least one of the non-parallel waveguide sections is periodically repeated.

34. The sampler of claim 26, further comprising a strobe waveguide transition configured to receive the sampling strobe pulses from the non-linear transmission line and to deliver enhanced strobe pulses to the sampling diode.

35. The sampler of claim 26, wherein the non-parallel waveguide is a slotline.

36. The sampler of claim 26, wherein the non-parallel waveguide is a coplanar stripline.

* * * * *

UNITED STATES PATENT AND TRADEMARK OFFICE
CERTIFICATE OF CORRECTION

PATENT NO.    : 6,900,710 B2
DATED         : May 31, 2005
INVENTOR(S)   : Agoston et al.

It is certified that error appears in the above-identified patent and that said Letters Patent is hereby corrected as shown below:

Column 3,
Line 17, "fine" should read -- line --.

Column 4,
Line 23, "in the a shockline" should read -- in the shockline or in a shockline --.
Line 23, "FIG. 1" should read -- FIG. 1. --.
Line 46, "lines" should read -- line --.

Column 5,
Line 58, "inputs" should read -- input --.

Column 6,
Line 31, "on a the substrate" should read -- on a substrate or on the substrate --.

Column 7,
Line 25, "or provide an" should read -- to provide a --.

Column 8,
Line 7, "signal" should read -- signal. --.

UNITED STATES PATENT AND TRADEMARK OFFICE
CERTIFICATE OF CORRECTION

PATENT NO. : 6,900,710 B2
DATED : May 31, 2005
INVENTOR(S) : Agoston et al.

It is certified that error appears in the above-identified patent and that said Letters Patent is hereby corrected as shown below:

Column 11,
Line 11, "includes" should read -- include --.
Line 46, "of a several sizes" should read -- of several sizes --.
Line 64, "describe" should read -- describes --.

Column 12,
Line 17, "provide" should read -- provided --.

Signed and Sealed this

Fourth Day of April, 2006

JON W. DUDAS
*Director of the United States Patent and Trademark Office*